United States Patent [19]
Ellis et al.

[11] Patent Number: 5,684,946
[45] Date of Patent: Nov. 4, 1997

[54] APPARATUS AND METHOD FOR IMPROVING THE EFFICIENCY AND QUALITY OF FUNCTIONAL VERIFICATION

[75] Inventors: James P. Ellis, Bolton; Mike Kantrowitz, Worcester; Will Sherwood, Sterling, all of Mass.

[73] Assignee: Digital Equipment Corporation, Maynard, Mass.

[21] Appl. No.: 526,293

[22] Filed: Sep. 11, 1995

[51] Int. Cl.[6] .................................................. G06F 11/00
[52] U.S. Cl. .............................. 395/183.09; 395/183.11; 371/27
[58] Field of Search .................... 395/183.09, 183.08, 395/183.11, 183.13, 183.15; 371/27, 22.1, 22.2, 22.3, 22.5, 22.6

[56] References Cited

U.S. PATENT DOCUMENTS

| | | | |
|---|---|---|---|
| 4,907,230 | 3/1990 | Heller et al. | 371/22.1 |
| 5,187,712 | 2/1993 | Malleo-Roach et al. | 371/22.1 |
| 5,202,889 | 4/1993 | Aharon et al. | 371/27 |
| 5,297,151 | 3/1994 | Gruetzner et al. | 371/27 |
| 5,323,400 | 6/1994 | Agarwal et al. | 371/22.3 |
| 5,323,401 | 6/1994 | Maston | 371/27 |
| 5,390,194 | 2/1995 | Mannle | 371/27 |
| 5,455,938 | 10/1995 | Ahmed | 371/27 |
| 5,479,414 | 12/1995 | Keller et al. | 371/27 |

OTHER PUBLICATIONS

Tamamoto et al., "A Current Testing for CMOS Logic Circuits Applying Random Patterns and Monitoring Dynamic Power Supply Current", Proceedings. 1st Asioan Test Symposium IEEE Computer Soc. Press, pp. 70–75, 1992.

Kantowitz, Michael and Noack, Lisa M., "Functional Verification of a Multiple–issue, Pipelined, Superscalar Alpha Processor —the Alpha 21164 CPU Chip", 1995, vol. 7, No. 1, pp. 136–143.

Gould, Lawrence, "Another Tool in the Planning Toolbox", Managing Automation, Jul. 1992, pp. 22–23.

Quinnell, Richard, A., "Experiment–design software puts your hardware to the test", EDN, Jul. 8, 1993, pp. 94–98.

"Logical Verification of the NVAX CPU Chip Design", Digital Technical Journal, vol. 4, No. 3, Summer 1992, pp. 38–46.

Ahi, Ali, M. et al., "Design Verification of the HP 9000 Series 700 PA–RISC Workstations", Aug. 1992, Hewlett–Packard Journal, pp. 34–42.

*Primary Examiner*—Robert W. Beausoliel, Jr.
*Assistant Examiner*—Joseph E. Palys
*Attorney, Agent, or Firm*—Kenneth F. Kozik

[57] ABSTRACT

A design verification system is provided which includes the ability to automatically correlate the response of a device under test to the input stimuli. The test system uses a pseudo-random exerciser to produce a set of test stimuli for application to a device under test. Once applied, the response of the device is recorded and an automatic correlation is performed using a chosen correlation engine. Once the correlation is complete a new set of stimuli is produced which results in improved test coverage for the device under test. The system is closed-loop and thus allows for iterative testing of a device under test.

8 Claims, 3 Drawing Sheets

APPARATUS AND METHOD FOR IMPROVING THE EFFICIENCY AND QUALITY OF FUNCTIONAL VERIFICATION

BACKGROUND OF THE INVENTION

This invention relates generally to computer systems and more particularly to a method and apparatus for verifying the design of a digital system, for example, a central processing unit (CPU) or computer system.

As is known in the art, a computer system generally includes a CPU, a memory system, a cache system, and an I/O system, all of which are interconnected by various busses. The CPU, which may be constructed of a single or multiple chips, also generally includes an arithmetic logic unit, a program counter, a plurality of high speed memory locations known as registers, a means for reading and writing memory, and control logic for fetching instructions to and from memory.

Once a computer system or a component of the computer system has been designed, system designers may need to verify the operation of each component and/or the overall design. The verification is done to ensure that each component, each of which may include several chips, operates as designed and that each component interfaces properly with each of the other elements of the system.

In order to verify that each element of the newly designed system functions properly, system verification engineers will create a computer model of the components (e.g. the CPU chip or chip set) to be tested. In addition, models will be created for each of the subsystem elements in order to provide stimulus to the device under test. Each element in the system has a unique model which represents its operation in the form of its response to input and output stimulus. The models can be created using specialized programming languages developed solely for that purpose, or they can be created using general-purpose programming languages such as the C programming language. Since the CPU is the heart of many computer systems, the model of the CPU is typically the most complex and sophisticated. In order to properly verify the functionality of the CPU, various stimulus are applied to the model (device under test) and the model's response to that stimulus is recorded and analyzed.

In order to sufficiently test any of the system components, the respective models must be exercised as extensively as possible. Prior art methods of testing a design included the creation of so-called focused tests. Focused tests are tests written by system verification engineers who choose the type and nature of the stimulus to be applied to the device under test. The focused tests are typically constructed by hand, by a system verification engineer with little or no automation. The focused test program, written by the system verification engineer, would include those test stimulus which the engineer feels are appropriate for the component or system being tested. In addition to creating the test stimulus program, the engineer would also need to build in a method of checking the results of the applied stimulus to the device under test.

Several problems exist for the focused test method of verifying a design. The first drawback is that it is a very labor intensive and tedious process which may require weeks for an engineer to design a simple test. A second drawback is that since the program is created primarily by human thought processes, there is little or no randomness in the selection of test stimulus to be applied to the model. This problem is further exasperated by the fact that typically system verification engineers work closely with system design engineers and thus may share the same mind sets. This leads to the possibility of overlooking tests which may need to be performed to ferret out any bugs in the design. Although focused test methods are still used to create very specialized test cases, this method has been primarily replaced by automated processes.

Another prior art method of creating verification test programs involves the use of so-called exercisers. An exerciser is a program which has knowledge of each of the possible commands which can be executed by the any of the components to be tested. It has further knowledge of possible delays or hand-shaking methods which will be used when the components communicate with other subsystems of the overall system. An exerciser randomly selects, from each of the parameters of which it has knowledge, operations to be performed by the model thus creating a test program to be applied to the device under test. The advantage of using exercisers is that they tend to provide for more complete tests in a shorter time frame. Further, utilizing an exerciser separates the design process mentality from the verification portion of a computer system design. Most importantly, the use of an exerciser allows the creation of events (that is the combination of various stimuli) that no system verification engineer may have ever thought of.

The use of exercisers are not without their own drawbacks. The first problem associated with using random exercisers is that it is typically a fully automated process with a high level of randomness. That being the case, it is hard to determine, and almost impossible to control, what exactly is being tested. That is, a system verification engineer may desire that certain types of functions be exercised heavily and the fact that the exerciser runs in a random fashion may not yield the desired test.

One of the primary difficulties with functional verification is that it is virtually impossible to know when the verification effort is complete. Completing a series of randomly generated tests may merely indicate that the tests are complete. That is, running random exercisers at various stages throughout the design process does not guarantee that the design has been fully tested. This drawback has led to the use of so-called coverage analysis techniques to determine if a component has indeed been tested as desired.

Coverage analysis involves the process of collecting information about the occurrence of simple events and also collecting signal traces during model testing. Using this information, analyses could be performed which allow system verification engineers to determine which areas may be lacking coverage during execution of the model test.

Although system verification engineers now had ways to generate entirely random tests and further had ways to determine whether these random tests were testing aspects of the computer design that the engineers felt were important, there was still no effective way to ensure that the exercisers would create the desired test since they were based on a totally random selection process. Creating desired tests then seemed to require a reversion back to the old method of creating focused tests, as described earlier. Thus, it would be advantageous to provide an improved verification process which could be automated and controlled in a manner that uses results of one test run to modify the input to subsequent test runs in order to get complete and efficient test coverage during the design and manufacturing processes.

SUMMARY OF THE INVENTION

In accordance with the present invention, a design verification system includes a test stimulus generator for generating a plurality of random input test stimuli for application to a device under test. The system also includes a means for applying the test stimuli to the device under test. The system further includes monitoring means for monitoring and recording responses of the device under test to the applied test stimuli. In addition the system includes correlation means coupled to the monitoring means and the test stimulus generator means for analyzing the responses to determine cause and effect relationships between input parameters of the test stimulus generation means and the responses. The correlation means then provides modified input parameters to the test stimulus generator means in order for the test stimulus generator means to generate, in a controlled fashion, a second plurality of test stimuli having more complete verification properties. With such an arrangement, an automated verification system is provided which includes the benefits of random exercisers while also including the benefits of focused test files. Use of the above described system achieves more complete test coverage for a given design in a shorter period.

In accordance with another aspect of the present invention, a method of verifying a circuit design includes generating, in a random fashion, according to a set of parameters, a first set of test stimuli. Once generated, the stimuli are applied to a device under test. During testing, the device under test is monitored with its responses to the stimuli being recorded. Once recorded, the responses are correlated to the input stimuli, and the parameters used to generate the stimuli, to establish a cause and effect relationship. After the correlation is complete, the parameters are adjusted and used to create another set of test stimuli. The new stimuli are applied to the device under test and the recording and correlation steps are repeated. This process is repeated until complete test coverage for the device under test is achieved. With such an arrangement, an automated verification system is provided which includes the benefits of random exercisers while also including the benefits of focused test files. Use of the above described method achieves more complete test coverage for a given design in a shorter period.

BRIEF DESCRIPTION OF THE DRAWINGS

The above-mentioned and other features of the invention will now become more apparent by reference to the following description taken in connection with the accompanying drawings in which.

DETAILED DESCRIPTION OF THE PREFERRED EMBODIMENT

Figure 1:
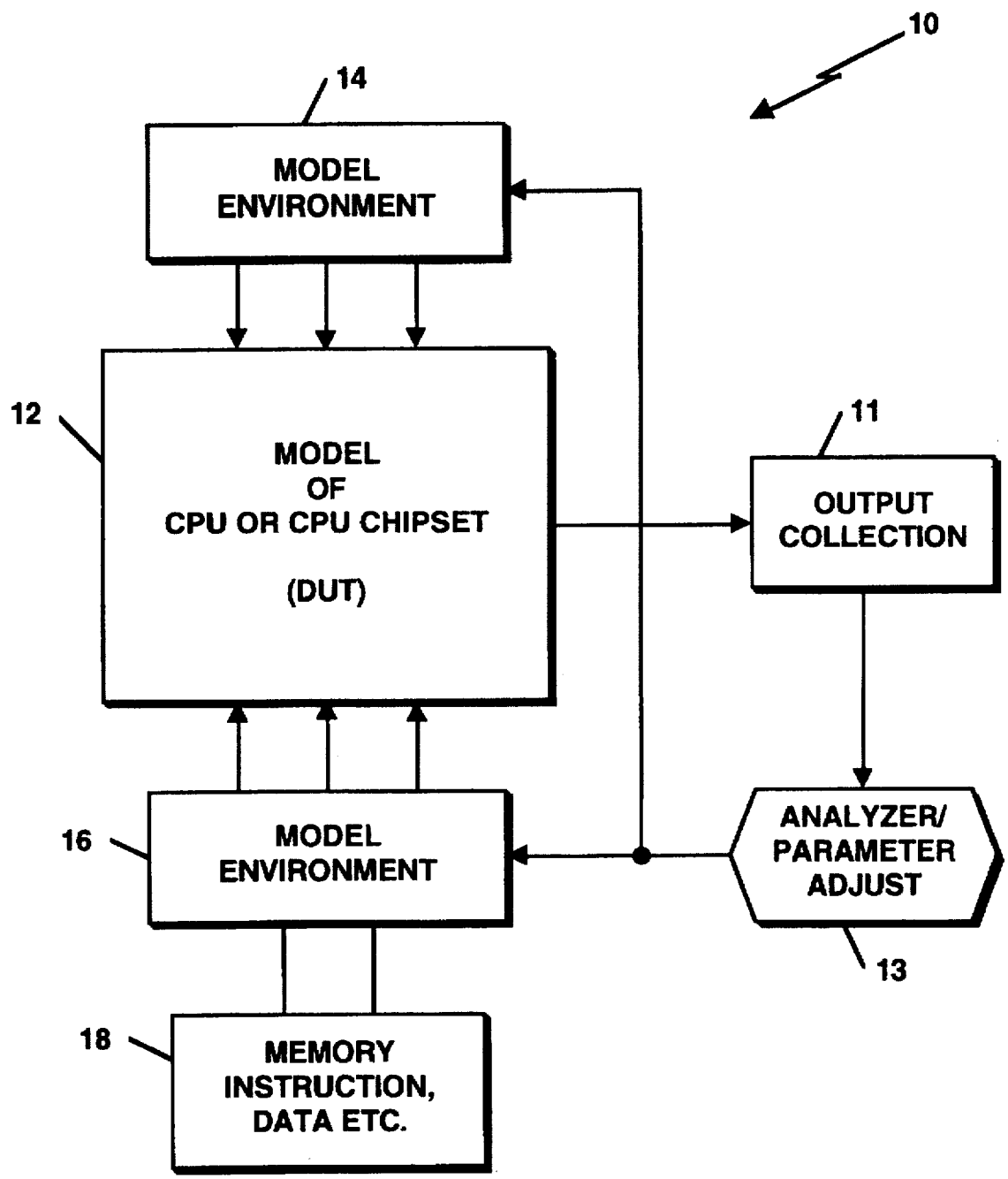
FIG. 1 is a block diagram of a design verification system for a computer system design.

Referring now to FIG. 1, design verification system 10 is shown to include model set 12 which receives as input stimulus, data from model environments 14 and 16. Verification system 10 is also shown to include an output collection system 11 as well as an analyzer/parameter adjust system 13 which receives as its input, an output from the output collection system 11.

Design model 12 represents a behavioral or functional model of a particular circuit design (e.g. a CPU chip or chip set) which needs to be verified. According to the preferred embodiment, the design verified is that of a CPU consisting of a single or multiple CPU chips. For simplicity, design model 12 can be thought of, and will hereinafter be referred to, as the device under test (DUT). The DUT 12 is a model which can be constructed using specialized programming languages such as Verilog or may be constructed using standard programming languages such as the C programming language. According to the preferred embodiment, the device under test is a model of a chip or chip set and is constructed of a multitude of data structures. It should be noted however, that device under test 12 could also be modeled using either queues, registers or multiplexers, and thus, the use of structure should not be seen as a limitation of the present invention.

A model such as DUT 12 is typically built after the system designers reach a point in their design where they would like to test the functional integrity of a particular CPU design. The method of testing the integrity of a CPU design involves subjecting the model or device under test 12 to enough stimuli such that the designers get a good understanding as to where the bugs in their system design may lie.

Figure 2:
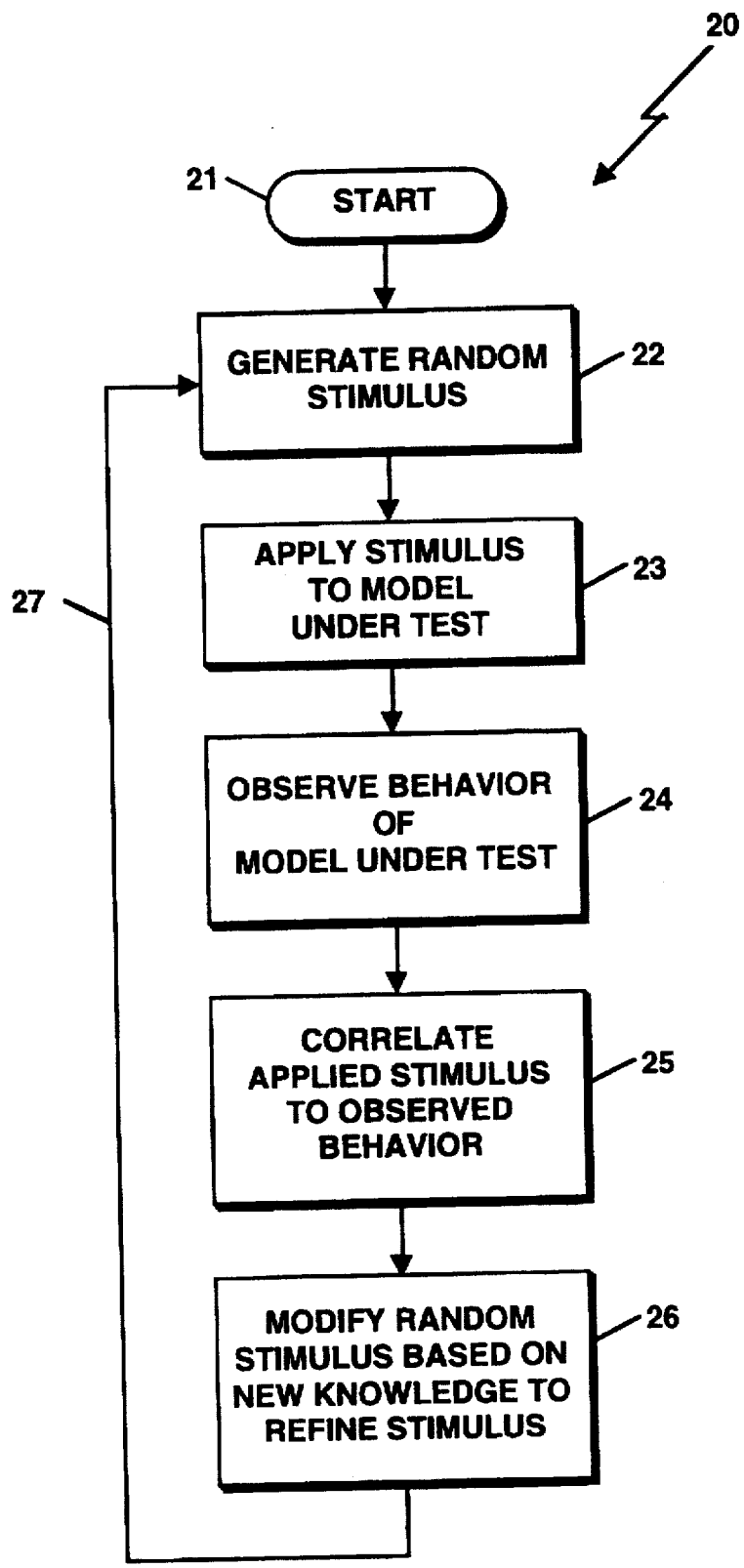
FIG. 2 is a flow chart for the operation of the verification system of the FIG 1.

According to the present invention, a test verification system is provided, which allows for iterative testing with the stimulus for each iteration being automatically controlled, using a correlation engine or process. Referring now to FIG. 2, the test system of the present invention is shown to operate according to flow chart 20. Operation essentially begins at step 22, which involves production of the initial stimulus. In general, there are many techniques available for providing input stimulus. In the preferred embodiment, random exercisers are typically used to create the test stimuli. Each method provides a way to generate focused or pseudo-random streams of input stimulus in a format acceptable by a particular device under test.

In order for the stimulus generation process of the present invention to be compatible with the test verification system, there is provided a mechanism to control the components that make up a complete stimulus stream. Further the probability of occurrence of each component is also controllable as a user-selectable parameter. For example, when generating a random stream for a CPU stimulus, it is desirable to have separate control over the probability of occurrence of each Opcode, register, memory address, data value, etc. The settings of each control parameter are recorded so that they may be used during the correlation process described below.

Once constructed, the stimulus stream needs to be applied to the model being tested. The particular way in which the input stream is applied to the device under test is specific to the particular design environment. In general, the verification process occurs within a simulation environment. It should be noted however that, according to the present invention, the process can be applied to prototype hardware as well as a simulation environment.

After the stimulus has been applied to the device under test, as in step 23, the process moves to step 24 where the behavior of the model, in response to the stimulus, is observed. The observation of the behavior of the device under test is typically achieved by recording the output of the model in some storage medium. Here, the output of the model may include internal signal levels of the device under test as well as values associated with internal queues of the device under test. Conventional output values (i.e. at the pin I/O of the device under test) may also be recorded.

Each CPU or CPU chip set design, in order to be tested fully, should be exposed to test stimuli which causes the device under test to experience so called interesting conditions. The interesting conditions for each design are specific to that design. However, certain classes of conditions tend to occur frequently. For example, combinations of back to back bus transactions or combinations of trap conditions are events frequently of interest to CPU designers. Thus, in order to ensure that a CPU design is operating properly, the test stimulus should include the causation of these occurrences. Since the test stimulus generation process may be an automated random process, whether or not the interesting conditions occur, is determined by application of the test program to the model, and observing the results (that is the output). Each occurrence of an interesting event is then recorded.

According to the present invention, a closed-loop stimulus generation and refinement technique is used to correlate the observed behavior of a device under test to the parameters used during the random test stimuli generation process. The correlation is used to refine the parameters to create test files which achieve desired behavior of the device under test during application of the test stimuli. Still referring to FIG. 2, the correlation process occurs at Step 25 of flowchart 20. The ability to correlate observed response of the device under test to the input parameters of the test generation process was born of a realization that the parameters which are used as input to the exercisers of Step 22 can indeed be controlled to influence the test generation process. Coupled with this realization was the development of an understanding of the interaction of the various parameters with each other. Using this information, the occurrence of desired events (i.e. interesting events) during testing may be advantageously influenced.

A second realization included a determination that the control of the parameters could be automated based upon knowledge of the input stimulus and output behavior of the device under test. Thus it was realized that input test stimulus could be continually refined in an automated way in order to provide a very efficient and complete test of a CPU chip model or chip set model.

Accordingly a method was developed which is capable of handling the large number of input variables and still provide useful and complete coverage during testing. According to the preferred embodiment of the present invention, an efficient statistical correlation technique known as Design Of Experiments (DOE) is used to correlate the parameters used in creating the input stimuli to the output response of the device under test. Here the Design Of Experiments technique is used to provide a feedback control system as shown in the flowchart 20 of FIG. 2.

Most digital system designs, where random verification is applied in order to test the design, are extremely complex systems. The input/output relationships between control parameter settings of abstract test stimulus and the occurrence of specific events in the design are not easy to specify. However, this specification is needed if the closed loop process is to be practical and produce an efficient test of the model.

Design Of Experiments is a statistical/mathematical approach for performing multivariable experimentation. DOE's main purpose is to provide an understanding of how multiple configurations of various stimuli affect the output results and further how each variable affects those results. The DOE approach accomplishes this by running a small scientifically selected sample of the input stimulus, on the process under study, (e.g. the chip device under test). The first step in using DOE methods is to gather data for analysis of a particular system's response over several iterative runs where the input parameters are set between their high and low values. After the data associated with the several runs has been gathered, an analysis may be performed, typically using a statistical analysis software package. The analysis involves building a mathematical model of the system which describes the relationship between all the input variables and a desired response. Accordingly, this analysis allows the determination of mathematical relations between several input factors and an output. Using this mathematical model, determinations can be made as to whether certain inputs contribute positively or negatively towards a desired output and further, how strong the certain inputs contribute to that output. Using this information, exercisers can be modified using the available parameter controls in order to maximize or minimize the output to produce desired or interesting results (i.e. adequate coverage for testing the device under test).

It should be understood that the use of DOE methods to correlate the parameters used to generate the input stimuli to observed response of the device under test is but one correlation method and should not be seen as a limitation of the present invention. In fact, other techniques for correlation, such as the use of a neural network may also be used as a correlation engine.

Still referring to FIG. 2, Step 26 of flowchart 20 provides for the modification of the random test stimulus based on the knowledge gained from Step 25 of flowchart 20. Modification is performed to increase the probability of causing interesting events to occur in the device under test. Modification is accomplished by adjusting the parameters which are used during the test generation step. Once modified, the new set of test stimulus is applied to the device under test, thus creating feedback loop 27 from Step 26 to Step 22. Steps 22–26 may be repeated as necessary until the desired test coverage has been achieved.

Note that the process of Steps 22–26 may be fully automated. Thus, the ability to achieve the best overall test coverage occurs within a much shorter period of time. This allows a design to be verified in a shorter period of time, ultimately leading to a shorter time to market for the associated products.

Figure 3:
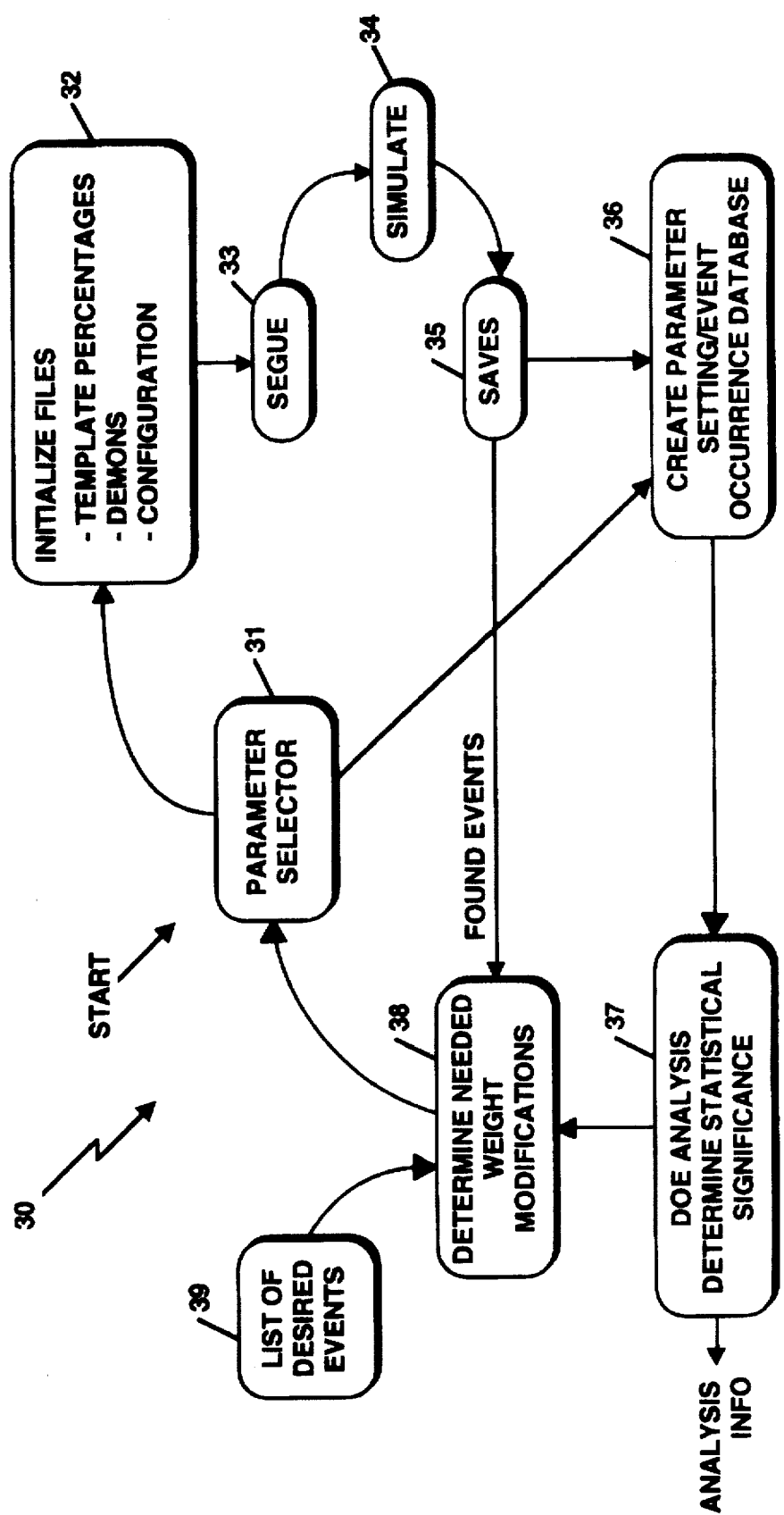
FIG. 3 is a more detailed flow chaff, employing Design Of Experiments, for the operation of the verification system of FIG 1.

In order to more fully understand the features of the invention, the closed stimulus generation and refinement process of flowchart 20 (FIG. 2) will now be discussed in more detail, in particular, utilizing the DOE correlation engine. Referring now to FIG. 3, flowchart 30 depicts a detailed operation of a closed loop stimulus generation and refinement system utilizing a DOE correlation engine. The process starts at step 31 with initial parameter selection for driving the random test file generation process. Once the parameters are set, the process moves to step 32 where other initialization files are created. Note also that the parameters selected in step 31 are copied to a database used in step 36. At step 33 the random test stimulus generation process (here using a program called SEGUE) is run which produces a test file of input stimuli to be applied to the device under test during step 34. For a more detailed description of the SEGUE program see co-pending patent application entitled "Method and Apparatus for Test Data Generation" filed on even date herewith. During application of the test stimuli, the output responses (described earlier) of the device under test are recorded in step. The recorded output is supplied to a process in step 36 which combines the output response data with the parameter information into a database. Also information about the types of events which occurred during the simulation run is recorded and furnished to the modification process of step 38.

The database is provided to the correlation engine, here a DOE engine, which establishes a statistically based cause and effect relationship between the input parameters selected in step 31 with the observed response of the device under test recorded in step 35. In step 38, the correlation information is then analyzed along with the event information from step 35. This information is used to then determine the modifications needed to achieve the desired events. Modification may be performed using a variety of methods. In the preferred embodiment a minimization/maximization technique using a mathematical model of the system response to the input parameters is used to effect the manner in which the parameters are modified. Additionally custom rules based methods may be used determined parameter modification. Once determined, the modification information is then used by step 31 to create new parameter settings. The process may then be repeated in an iterative fashion until complete test coverage has been achieved.

Having described a preferred embodiment of the invention, it will be apparent to one of skill in the art that changes to this embodiment and other embodiments may be used without departing from the principles and spirit of the invention, the scope of which is defined by the appended claims.

What is claimed is:

1. A design verification system comprising:

test stimulus generator means for generating a plurality of input test stimuli for application to a device under test;

application means for applying said test stimuli to said device under test;

monitoring means for monitoring and recording responses of said device under test to said test stimuli and for monitoring occurrences of predetermined events resulting from said test stimuli;

correlation means coupled to said monitoring means and said test stimulus generator means for analyzing said responses to determine cause and effect relationships between input parameters of said test stimulus generation means and said responses and for providing modified input parameters to said test stimulus generator means in order for said test stimulus generator means to generate, in a controlled fashion, a second different plurality of test stimuli for producing desired responses and occurrences of said predetermined events.

2. The system of claim 1 wherein said responses include internal signals of said device under test, values stored in queues of said device under test, and signal values at input/output pins of said device under test.

3. The system of claim 1 wherein said correlation means is a correlation engine based on Design Of Experiments (DOE) techniques.

4. The system of claim 3 wherein said correlation engine is a software program executed by a computer system.

5. A method of verifying a circuit design comprising the steps of:

a) generating, according to a set of parameters, a first set of test stimuli;

b) applying said first set of test stimuli to a device under test;

c) monitoring and recording responses of said device under test to said applied stimuli;

d) correlating said responses with said applied stimuli to determine which input stimuli provide desired responses;

e) modifying, based on said correlating step, said set of parameters associated with said generating step to provide parameters that produce said desired responses;

f) generating, responsive to said modified set of parameters, a second set of test stimuli for providing increased test coverage; and g) repeating steps b through f until complete test coverage of said device under test is achieved and all desired responses have been produced.

6. The method of claim 5 wherein said correlating step includes the steps of analyzing, using Design Of Experiments (DOE) techniques, said parameters and said responses to establish a cause and effect relationship therebetween.

7. The method according to claim 5 wherein said test stimuli are generated randomly.

8. The method of claim 5 wherein said modifying step includes creating a model of the system response and performing a minimization/maximization analysis on the model.

* * * * *